US012696617B2

(12) United States Patent
Zhang et al.

(10) Patent No.: US 12,696,617 B2
(45) Date of Patent: Jul. 28, 2026

(54) ARRAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wei Zhang, Beijing (CN); Youngyik Ko, Beijing (CN); Quan Shi, Beijing (CN); Shanshan Bai, Beijing (CN); Hongli Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 498 days.

(21) Appl. No.: 17/789,546

(22) PCT Filed: Mar. 16, 2022

(86) PCT No.: PCT/CN2022/081216
§ 371 (c)(1),
(2) Date: Jun. 28, 2022

(87) PCT Pub. No.: WO2022/194215
PCT Pub. Date: Sep. 22, 2022

(65) Prior Publication Data
US 2025/0017068 A1    Jan. 9, 2025

(30) Foreign Application Priority Data

Mar. 16, 2021    (WO) ................ PCT/CN2021/081026
Apr. 30, 2021    (WO) ................ PCT/CN2021/091626

(51) Int. Cl.
*H10K 59/00* (2023.01)
*H10K 59/121* (2023.01)
(Continued)

(52) U.S. Cl.
CPC ......... *H10K 59/121* (2023.02); *H10K 59/122* (2023.02); *H10K 59/131* (2023.02);
(Continued)

(58) Field of Classification Search
CPC .. H10K 59/352; H10K 59/353; H10K 59/121; H10K 59/122; H10K 59/131
See application file for complete search history.

(56) References Cited

U.S. PATENT DOCUMENTS 11,561,465 B2    1/2023    Ji
2011/0260952 A1    10/2011    Hwang et al.
(Continued)

FOREIGN PATENT DOCUMENTS

CN    104269411 A    1/2015
CN    105552102 A    5/2016
(Continued)

OTHER PUBLICATIONS

Extended European search report issued by the European Patent Office in European Application No. 22770557.1; Mailing Date: Sep. 27, 2023.
(Continued)

*Primary Examiner* — Reema Patel
(74) *Attorney, Agent, or Firm* — Dilworth & Barrese, LLP.; Michael J. Musella, Esq.

(57) ABSTRACT

An array substrate and a display device are provided. The array substrate includes a plurality of sub-pixel repeating units, each sub-pixel repeating unit includes four first color sub-pixels, two second color sub-pixels and two third color sub-pixels, in each sub-pixel repeating unit, the shape of
(Continued)

100 each first color sub-pixel is an axisymmetric figure, centers of the four first color sub-pixels are located on a same virtual line, a center of one of the two second color sub-pixels and a center of one of the two third color sub-pixels are located on a first side of the virtual line, a center of the other one of the two second color sub-pixels and a center of the other one of the two third color sub-pixels are located on a second side of the virtual line.

19 Claims, 7 Drawing Sheets

(51) Int. Cl.
 *H10K 59/122* (2023.01)
 *H10K 59/131* (2023.01)
 *H10K 59/35* (2023.01)
(52) U.S. Cl.
 CPC ......... *H10K 59/352* (2023.02); *H10K 59/353* (2023.02); *H10K 59/351* (2023.02)

(56) References Cited

U.S. PATENT DOCUMENTS

| | | |
|---|---|---|
| 2016/0078807 A1 | 3/2016 | Sun et al. |
| 2016/0254476 A1 | 9/2016 | Park |
| 2016/0357076 A1 | 12/2016 | Huangfu et al. |
| 2018/0088260 A1 | 3/2018 | Jin et al. |
| 2018/0308907 A1 | 10/2018 | Jin et al. |
| 2018/0315801 A1 | 11/2018 | Matsueda |
| 2019/0011830 A1 | 1/2019 | Ji |
| 2019/0140030 A1 | 5/2019 | Huangfu et al. |
| 2019/0252469 A1 | 8/2019 | Xiao et al. |
| 2020/0013833 A1 | 1/2020 | Wang et al. |
| 2020/0043990 A1 | 2/2020 | Huangfu et al. |
| 2020/0066809 A1 | 2/2020 | Liu |
| 2020/0127060 A1 | 4/2020 | Li et al. |
| 2020/0212125 A1 | 7/2020 | Liu et al. |
| 2020/0312941 A1 | 10/2020 | Na et al. |
| 2020/0357862 A1 | 11/2020 | Wang et al. |
| 2021/0335909 A1 | 10/2021 | Wang et al. |
| 2022/0208891 A1 | 6/2022 | Liu et al. |
| 2022/0310712 A1 | 9/2022 | Zhao et al. |
| 2023/0058293 A1 | 2/2023 | Liu et al. |

FOREIGN PATENT DOCUMENTS

| | | |
|---|---|---|
| CN | 205355055 U | 6/2016 |
| CN | 107644888 A | 1/2018 |
| CN | 107968103 A | 4/2018 |
| CN | 207883217 U | 9/2018 |
| CN | 208077981 U | 11/2018 |
| CN | 109994503 A | 7/2019 |
| CN | 110137213 A | 8/2019 |
| CN | 110459574 A | 11/2019 |
| CN | 110599954 A | 12/2019 |
| CN | 110690266 A | 1/2020 |
| CN | 111341817 A | 6/2020 |
| CN | 111755483 A | 10/2020 |
| CN | 112038375 A | 12/2020 |
| EP | 3419054 A1 | 5/2016 |
| WO | 2018090630 A | 5/2018 |

OTHER PUBLICATIONS

Extended European search report issued by the European Patent Office in European Application No. 22770568.8; Mailing Date: Oct. 12, 2023.

US Final Office Action of U.S. Appl. No. 17/790,979; Mailing Date: Mar. 20, 2025.

US First Office Action of U.S. Appl. No. 17/790,577; Mailing Date: Mar. 31, 2025.

US Office Action from U.S. Appl. No. 17/790,979; Mailing Date : Nov. 1, 2024.

Second US Office Action in U.S. Appl. No. 17/790,979; Mailing Date : Oct. 17, 2025.

U.S. Office Action from U.S. Appl. No. 17/790,577; Mailing Date: Mar. 6, 2026.

Display device 500

Array substrate 100

100

ARRAY SUBSTRATE AND DISPLAY DEVICE

This application claims priority to PCT application PCT/CN2021/091626 filed on Apr. 30, 2021 and PCT application PCT/CN2021/081026 filed on Mar. 16, 2021, the present disclosures of which are incorporated herein by reference in their entirety as part of the present disclosure.

TECHNICAL FIELD

The embodiment of the present disclosure relates to an array substrate and a display device.

BACKGROUND

With the continuous development of display technology, people have higher and higher requirements for display quality of display devices. Organic light-emitting diode (OLED) display device are used more and more widely, due to their advantages of wide color gamut, fast response, foldable, bendable and high contrast ratio. On the other hand, people have higher and higher requirements for the resolution of the organic light-emitting diode (OLED) display devices.

In the organic light-emitting diode (OLED) display devices, a pixel arrangement mode or a pixel arrangement structure has a great influence on the display quality and the resolution, thus the pixel arrangement mode or the pixel arrangement structure is also one of the important directions for major manufacturers to study and improve.

SUMMARY

At least one embodiment of the present disclosure provides an array substrate and a display device. In the array substrate, because the centers of the four first color sub-pixels are located on the same virtual line extending along the second direction, the center of one second color sub-pixel of the two second color sub-pixels and the center of one third color sub-pixel of the two third color sub-pixels are located on the first side of the virtual line in the first direction, and the center of the other one second color sub-pixel of the two second color sub-pixels and the center of the other one third color sub-pixel of the two third color sub-pixels are located on the second side of the virtual line in the first direction, as such, upon the array substrate being used for displaying a vertical line extending along the second direction, and the first color sub-pixel is a color to which human eye is sensitive, "sense of fluctuation" of the vertical line seen by human eyes is relatively weak, thereby reducing or even eliminating the graininess sense of the display picture, and making the line of the display picture more continuous and natural.

At least one embodiment of the present disclosure provides an array substrate, which includes: a plurality of sub-pixel repeating units, repetitively arranged along at least one of a first direction and a second direction, each of the plurality of sub-pixel repeating units comprises four first color sub-pixels, two second color sub-pixels and two third color sub-pixels, and the first direction intersects the second direction, in one of the plurality of sub-pixel repeating units, a shape of each of the four first color sub-pixels comprises an edge parallel to the first direction and an edge parallel to the second direction, and the shape of each of the four first color sub-pixels is an axisymmetric figure, and at least one symmetrical axis of the axisymmetric figure is parallel to the first direction or the second direction, centers of the four first color sub-pixels are located on a same virtual line extending along the second direction, a center of one second color sub-pixel of the two second color sub-pixels and a center of one third color sub-pixel of the two third color sub-pixels are located on a first side of the virtual line in the first direction, a center of the other one second color sub-pixel of the two second color sub-pixels and a center of the other one third color sub-pixel of the two third color sub-pixels are located on a second side of the virtual line in the first direction.

For example, in the array substrate provided by an embodiment of the present disclosure, in one of the plurality of sub-pixel repeating units, a size in the second direction of a shape of one of the two second color sub-pixels is greater than a size in the second direction of a shape of one of the four first color sub-pixels, a size in the second direction of a shape of one of the two third color sub-pixels is greater than a size in the second direction of a shape of one of the four first color sub-pixels.

For example, in the array substrate provided by an embodiment of the present disclosure, in the plurality of sub-pixel repeating units, one second color sub-pixel of the two second color sub-pixels and one third color sub-pixel of the two third color sub-pixels are located on the first side of the virtual line in the first direction, the other one second color sub-pixel of the two second color sub-pixels and the other one third color sub-pixel of the two third color sub-pixels are located on the second side of the virtual line in the first direction, a shape of each of the two second color sub-pixels comprises a edge parallel to the second direction, and a shape of each of the two third color sub-pixels comprises a edge parallel to the second direction.

For example, in the array substrate provided by an embodiment of the present disclosure, in the plurality of sub-pixel repeating units, a longest edge parallel to the second direction of the shape of each of the two second color sub-pixels is greater than a length of at least one edge parallel to the second direction of a shape of the first color sub-pixel, a longest edge parallel to the second direction of the shape of each of the two third color sub-pixels is greater than a length of at least one edge parallel to the second direction of a shape of the first color sub-pixel.

For example, in the array substrate provided by an embodiment of the present disclosure, in one of the plurality of sub-pixel repeating units, an arrangement sequence in the second direction of the second color sub-pixel and the third color sub-pixel on the first side of the four first color sub-pixels is reversed from an arrangement sequence in the second direction of the second color sub-pixel and the third color sub-pixel on the second side of the four first color sub-pixels.

For example, in the array substrate provided by an embodiment of the present disclosure, in one of the plurality of sub-pixel repeating units, orthographic projections of the second color sub-pixel and the third color sub-pixel that are located on a same side of the four first color sub-pixels in the first direction on a reference line parallel to the first direction are overlapped with each other, a connection line between a center of the second color sub-pixel and a center of the third color sub-pixel on a same side of the four first color sub-pixels in the first direction is not parallel to the second direction.

For example, in the array substrate provided by an embodiment of the present disclosure, in one of the plurality of sub-pixel repeating units, a size in the second direction of a sub-portion of at least one of the two second color sub-pixels away from the four first color sub-pixels is smaller than a size in the second direction of a sub-portion of the at least one of the two second color sub-pixels adjacent to the four first color sub-pixels, a size in the second direction of a sub-portion of at least one of the two third color sub-pixels away from the four first color sub-pixels is smaller than a size in the second direction of a sub-portion of the at least one of the two third color sub-pixels adjacent to the four first color sub-pixels.

For example, in the array substrate provided by an embodiment of the present disclosure, a shape of the second color sub-pixel comprises an edge parallel to the first direction, an edge parallel to the second direction and an inclined edge with an included angle with both the first direction and the second direction; and/or, a shape of the third color sub-pixel comprises an edge parallel to the first direction, an edge parallel to the second direction and an inclined edge with an included angle with both the first direction and the second direction.

For example, in the array substrate provided by an embodiment of the present disclosure, in the plurality of sub-pixel repeating units, areas of the four first color sub-pixels are equal.

For example, in the array substrate provided by an embodiment of the present disclosure, in one of the plurality of sub-pixel repeating units, at least part of edges adjacent to the four first color sub-pixels of the second color sub-pixel and the third color sub-pixel on a same side in the first direction of the four first color sub-pixels are both parallel to the second direction, and at least part of edges away from the four first color sub-pixels of the second color sub-pixel and the third color sub-pixel on a same side in the first direction of the four first color sub-pixels are also both parallel to the second direction.

For example, in the array substrate provided by an embodiment of the present disclosure, in one of the plurality of sub-pixel repeating units, a span length in the second direction of the second color sub-pixel and the third color sub-pixel on a same side of the four first color sub-pixels in the first direction is less than or equal to a span length in the second direction of the four first color sub-pixels.

For example, in the array substrate provided by an embodiment of the present disclosure, in one of the plurality of sub-pixel repeating units, light-emitting layers of at least two first color sub-pixels of the four first color sub-pixels are continuously disposed.

For example, in the array substrate provided by an embodiment of the present disclosure, in one of the plurality of sub-pixel repeating units, the second color sub-pixel and the third color sub-pixel on a same side of the four first color sub-pixels in the first direction have a first parallel edge and a second parallel edge that are disposed to face and parallel to each other.

For example, in the array substrate provided by an embodiment of the present disclosure, a distance between the first parallel edge and the second parallel edge is a minimum distance between the second color sub-pixel and the third color sub-pixel.

For example, in the array substrate provided by an embodiment of the present disclosure, a length of the first parallel edge is equal to a length of the second parallel edge.

For example, in the array substrate provided by an embodiment of the present disclosure, an orthographic projection of the first parallel edge on a reference line parallel to the first direction is overlapped with an orthographic projection of the second parallel edge on the reference line parallel to the first direction.

For example, in the array substrate provided by an embodiment of the present disclosure, in one of the plurality of sub-pixel repeating units, a spacing between the two third color sub-pixels in the second direction is less than a spacing between the two second color sub-pixels in the second direction.

For example, in the array substrate provided by an embodiment of the present disclosure, in one of the plurality of sub-pixel repeating units, the four first color sub-pixels comprise two sub-pixel pairs arranged along the second direction, each of the two sub-pixel pairs comprises two first color sub-pixels of the four first color sub-pixels, a distance between the two sub-pixel pairs is greater than a distance between the two first color sub-pixels in one of the two sub-pixel pairs.

For example, in the array substrate provided by an embodiment of the present disclosure, in one of the plurality of sub-pixel repeating units, the two first color sub-pixels in each of the two sub-pixel pairs are symmetrically disposed, and the two sub-pixel pairs are symmetrically disposed.

For example, in the array substrate provided by an embodiment of the present disclosure, in one of the plurality of sub-pixel repeating units, orthographic projections of the four first color sub-pixels on a reference line along the first direction are overlapped with each other, and sizes of the four first color sub-pixels on a reference line in the second direction are equal.

For example, in the array substrate provided by an embodiment of the present disclosure, in one of the plurality of sub-pixel repeating units, an orthographic projection of each of the two second color sub-pixels on a reference line parallel to the second direction falls within an orthographic projection of one of the two third color sub-pixels on the reference line.

For example, in the array substrate provided by an embodiment of the present disclosure, the first color sub-pixel is configured to emit a light of green color, the second color sub-pixel is configured to emit a light of red color, and the third color sub-pixel is configured to emit a light of blue color.

At least one embodiment of the present disclosure further provides a display device, which includes any one of the abovementioned array substrate.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect.

In general, resolution of a display device can be increased by reducing sizes of pixels and reducing spacings between pixels. However, the reducing of the sizes of the pixels and the reducing of the spacings between the pixels also requires higher and higher precision of a corresponding manufacturing process, so that difficulty of the manufacturing process and manufacturing cost of the display device are increased. On the other hand, a sub-pixel rendering (Sup-Pixel Rendering, SPR) technology can use difference in resolution of different color sub-pixels by the human eye, to change a conventional mode of simply defining a pixel by using red, green, and blue sub-pixels, by sharing certain positional resolution-insensitive color sub-pixels between different pixels, with a relatively small number of sub-pixels, performance capability of a same pixel resolution is achieved by simulation, so that the difficulty of the manufacturing process and the manufacturing cost are reduced. However, a pixel arrangement structure using the sub-pixel rendering (SPR) technology will have some adverse effects on the display quality, for example, the display image has a grainy and wavy feeling, and the lines in the display image are discontinuous.

Figure 1A:
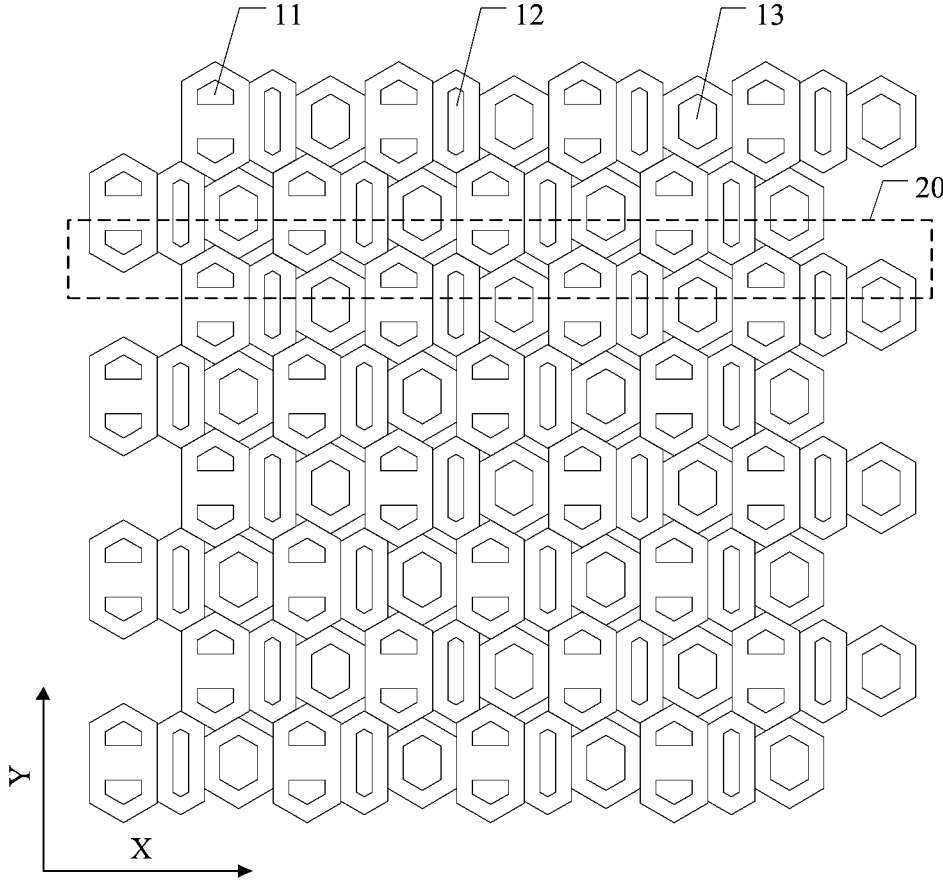
FIG. 1A is a schematic diagram of an array substrate.
Figure 1B:
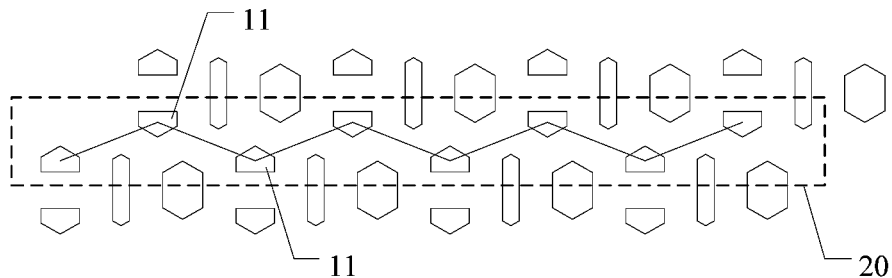
FIG. 1B is a schematic diagram of a sub-pixel row in an array substrate.

FIG. 1A is a schematic diagram of an array substrate; FIG. 1B is a schematic diagram of a sub-pixel row in an array substrate. As shown in FIG. 1A, the array substrate 10 includes a first sub-pixel 11, a second sub-pixel 12 and a third sub-pixel 13. A color of light emitted by the first sub-pixel 11 can be a color sensitive to human eyes, that is, in a case that a human eye performs visual synthesis, the color of the light emitted by the first sub-pixel 11 accounts for a higher proportion. As shown in FIG. 1B, in a sub-pixel row 20 formed by the first sub-pixel 11 along the first direction, positions of adjacent first sub-pixels 11 in the second direction are quite different, that is, a distance between the centers of the adjacent first sub-pixels 11 in the second direction is relatively large; therefore, in a case that the array substrate is used for straight lines, the straight lines in human vision has a strong "sense of fluctuation" or "sense of jaggedness", so that the quality of the displayed image is degraded.

In this regard, embodiments of the present disclosure provide an array substrate and a display device. The array substrate includes a plurality of pixel groups, each of the pixel groups includes a first sub-pixel, a second sub-pixel, a third sub-pixel and a fourth sub-pixel; in each of the pixel groups, a first connection line of a center of one of the first sub-pixels and a center of one of the second sub-pixels is intersected with a second connection line of a center of one of the third sub-pixels and a center of one of the fourth sub-pixels; the plurality of pixel groups are arranged along the first direction to form N pixel group rows, the N pixel group rows are arranged in the second direction, two adjacent pixel group rows are arranged in a staggered manner in the first direction; multiple first sub-pixels in the i-th pixel group row and multiple second sub-pixels in the (i+1)-th pixel group row are alternately arranged in the first direction, to form one of the sub-pixel rows, in each of the sub-pixel rows, an included angle between a connection line of a center of one of the first sub-pixels and a center of one of the second sub-pixels that are adjacent to each other and the first direction is less than 20 degrees, N is a positive integer greater than or equal to 3, and i is a positive integer greater than or equal to 1 and less than or equal to N. In the array substrate, the first sub-pixels and the second sub-pixels may be sub-pixels that emit light of a same color, and the color can be a sub-pixel that is sensitive to the human eye. Because the included angle between the connection line of the center of the one of the first sub-pixels and the center of the one of the second sub-pixels that are adjacent to each other and the first direction is less than 20 degrees, the fluctuation of the sub-pixel row is smaller, the sub-pixel row is closer to a straight line in human vision, so that the "sense of fluctuation" or "sense of jaggedness" of the display image can be alleviated or even eliminated, and thus lines of the display image are more continuous and natural.

Hereinafter, the array substrate and the display device provided by the embodiments of the present disclosure will be described in detail with reference to the accompanying drawings.

Figure 2A:
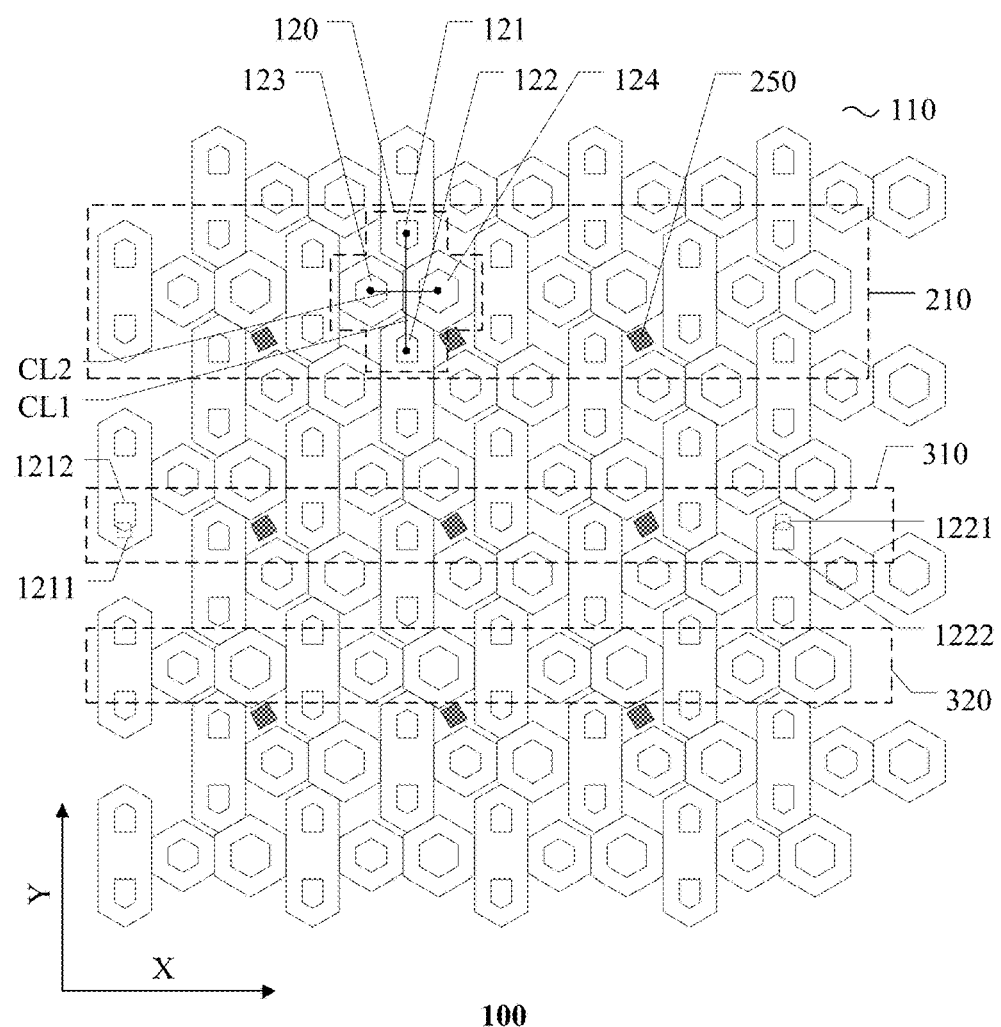
FIG. 2A is a schematic diagram of an array substrate provided by an embodiment of the present disclosure.
Figure 2B:
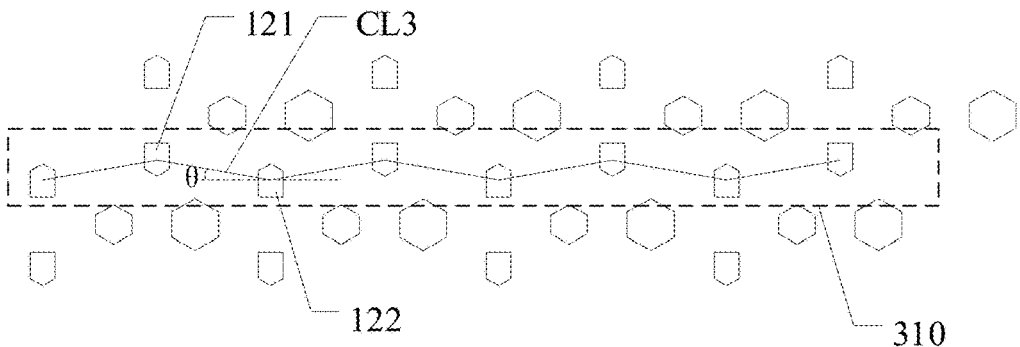
FIG. 2B is a schematic diagram of a display effect of a sub-pixel row in an array substrate provided by an embodiment of the present disclosure.

An embodiment of the present disclosure provides an array substrate. FIG. 2A is a schematic diagram of an array substrate provided by an embodiment of the present disclosure. FIG. 2B is a schematic diagram of a display effect of a sub-pixel row in an array substrate provided by an embodiment of the present disclosure.

As shown in FIG. 2A and FIG. 2B, the array substrate 100 includes a plurality of first sub-pixel rows 310 and a plurality of second sub-pixel rows 320; each of the first sub-pixel rows 310 includes a plurality of first sub-pixels 121 and a plurality of second sub-pixels 122 arranged alternately in the first direction; each of the second sub-pixel rows 320 includes a plurality of third sub-pixels 123 and a plurality of fourth sub-pixels 124 arranged alternately in the first direction; the plurality of first sub-pixel rows 310 and the plurality of second sub-pixel rows 320 are alternately arranged along the second direction. The second direction is intersected with the first direction, for example, the second direction and the first direction are perpendicular to each other. It should be noted that, the above-mentioned "the second direction and the first direction are perpendicular to each other" includes that the first direction and the second direction are strictly perpendicular to each other, that is, a case that an included angle between the first direction and the second direction is 90 degrees, and also includes that the first direction and the second direction are substantially perpendicular to each other, that is, a case that the included angle between the first direction and the second direction is in a range of 80 degrees to 100 degrees.

As shown in FIGS. 2A and 2B, in one of the first sub-pixel rows 310, the included angle between the connection line of the center of the first sub-pixel 121 and the center of the second sub-pixel 122 that are adjacent to each other and the first direction is less than 20 degrees.

In the array substrate provided by the embodiment of the present disclosure, the first sub-pixel 121 and the second sub-pixel 122 may be sub-pixels that emit light of the same color, and the color of the sub-pixels is sensitive to the human eye. Because the included angle θ between the connection line of the center of the first sub-pixel 121 and the center of the second sub-pixel 122 that are adjacent to each other in the first sub-pixel row 310 and the first direction is less than 20 degrees, the fluctuation of the first sub-pixel row 310 is smaller, and the first sub-pixel row 310 is closer to a straight line in human vision, which can alleviate or even eliminate the "sense of fluctuation" or "sense of jaggedness" of the display image, and make the lines of the display image more continuous and natural.

In some examples, as shown in FIG. 2A, the array substrate 100 includes a base substrate 110 and a plurality of pixel groups 120 located on the base substrate 110; each of the plurality of pixel group 120 includes a first sub-pixel 121, a second sub-pixel 122, a third sub-pixel 123 and a fourth sub-pixel 124. In each of the plurality of the pixel groups 120, a first connection line CL1 between a center of the first sub-pixel 121 and a center of the second sub-pixel 122 is intersected with a second connection line CL2 between a center of the third sub-pixel 123 and a center of the fourth sub-pixel 124. It should be noted that, in the pixel group 120, the first sub-pixel 121 and the second sub-pixel 122 can be sub-pixels that emit light of a same color; in addition, shapes of the first sub-pixel 121 and the second sub-pixel 122 may also be the same, and the difference between the first sub-pixel 121 and the second sub-pixel 122 is that their positions are different. In addition, the above-mentioned "center" refers to a luminance center or a geometric center of an effective light-emitting region of each of the sub-pixels.

As shown in FIG. 2A, the plurality of pixel groups 120 are arranged along the first direction to form N pixel group rows 210; the N pixel group rows 210 are arranged in the second direction, two pixel group rows 210 which are adjacent to each other are arranged in a staggered manner in the first direction, that is, centers of orthographic projections of the pixel groups with a same ordinal number in the two pixel group rows 210 which are adjacent to each other on a reference line extending in the first direction do not overlap. Therefore, the two pixel group rows 210 which are adjacent to each other can be arranged closer and more closely in the second direction, so as to improve the pixel density or resolution.

As shown in FIGS. 2A and 2B, multiple first sub-pixels 121 in an i-th pixel group row 210 and multiple second sub-pixels 122 in an (i+1)-th pixel group row 210 are alternately arranged in the first direction, to form the above-mentioned first sub-pixel row 310; in addition, in a first sub-pixel row 310, an included angle θ between a connection line of a center of the first sub-pixel 121 and a center of the second sub-pixel 122 that are adjacent to each other and the first direction is less than 20 degrees, N is a positive integer greater than or equal to 3, and i is a positive integer greater than or equal to 1 and less than or equal to N.

In the array substrate provided by the embodiment of the present disclosure, the first sub-pixel 121 and the second sub-pixel 122 may be sub-pixels that emit light of a same color, and the color of the sub-pixels is sensitive to the human eye. Because the included angle θ between the connection line of the center of the first sub-pixel 121 and the center of the second sub-pixel 122 that are adjacent to each other in the first sub-pixel row 310 and the first direction is less than 20 degrees, the sense of fluctuation of the first sub-pixel row 310 is smaller, and the first sub-pixel row 310 is closer to a straight line in human vision, so that the "sense of fluctuation" or "sense of jaggedness" of the display image can be alleviated or even eliminated, and thus the lines of the display image are more continuous and natural.

In addition, in one of the pixel groups 120, the sub-pixel rendering (SPR) technology may be used to make that that the first sub-pixel 121 and the second sub-pixel 122 use the third sub-pixel 123 and the fourth sub-pixel 124 respectively to form two pixels in an analog manner, so that the pixel resolution can be improved, and the difficulty of the manufacturing process and the manufacturing cost can be reduced.

For example, multiple third sub-pixels 123 and multiple fourth sub-pixels 124 in the i-th pixel group row 210 are alternately arranged in the first direction, to form a second sub-pixel row 320.

In some examples, the first sub-pixel is configured to emit light of a first color, the second sub-pixel is configured to emit light of a second color, and the first color and the second color are the same. For example, the first sub-pixel 121 and the second sub-pixel 122 are configured to emit green light, that is, both the first color and the second color are green. It should be noted that the green light is sensitive to the human eye, thus in human vision, a brightness center of the pixel will be close to a brightness center of a green sub-pixel.

In some examples, the third sub-pixel is configured to emit light of a third color, the fourth sub-pixel is configured to emit light of a fourth color, the third color, the fourth color and the first color are different from each other, a luminous efficiency of the third sub-pixel is greater than a luminous efficiency of the fourth sub-pixel. For example, the first color and the second color are green, the third color is red, and the fourth color is blue. Of course, the embodiments of the present disclosure include but are not limited to this.

In some examples, as shown in FIG. 2A, further, in the first sub-pixel row 310, the included angle θ between the connection line of the center of the first sub-pixel 121 and the center of the second sub-pixel 122 that are adjacent to each other and the first direction is less than 15 degrees. Because the included angle θ between the connection line of the center of the first sub-pixel 121 and the center of the second sub-pixel 122 that are adjacent to each other and the first direction is less than 15 degrees, the sense of fluctuation of the first sub-pixel row 310 can be further reduced, so that the "sense of fluctuation" or "sense of jaggedness" of the display image can be further alleviated or even eliminated.

In some examples, as shown in FIG. 2A, in the first sub-pixel row 310, the included angle θ between the connection line of the center of the first sub-pixel 121 and the center of the second sub-pixel 122 that are adjacent to each other and the first direction is in the range of 9 degrees to 11 degrees, for example, 10 degrees. In this way, the array substrate can make the included angle between the connection line CL and the first direction smaller by changing aspect ratios of the third sub-pixel and the fourth sub-pixel, so that the "sense of fluctuation" or "sense of jaggedness" of the display image is further alleviated or even eliminated.

In some examples, as shown in FIGS. 2A and 2B, orientations of the first sub-pixels 121 and the second sub-pixels 122 that are adjacent to each other in the first sub-pixel row 310 are different, that is, shapes of orthographic projections of the first sub-pixel 121 on the base substrate 110 are exactly the same as shapes of orthographic projections of the second sub-pixels 122 on the base substrate 110 after being rotated by a certain angle (for example, 180 degrees).

In some examples, as shown in FIGS. 2A and 2B, shapes of the orthographic projections of the first sub-pixels 121 on the base substrate 110 include first protrusions 1211, shapes of the orthographic projections of the second sub-pixels 122 on the base substrate 110 include second protrusions 1221, and orientations of the first protruding portions 1211 and the second protruding portions 1221 are opposite.

In some examples, as shown in FIGS. 2A and 2B, the shapes of the orthographic projections of the first sub-pixels 121 on the base substrate 110 further include first bottom edges 1212 arranged opposite to the first protrusions 1211, the shapes of the orthographic projections of the second sub-pixels 122 on the base substrate 110 include second bottom edges 1222 arranged opposite to the second protrusions 1221, the first bottom edges 1212 and the second bottom edges 1222 are not located on a same straight line.

In some examples, as shown in FIGS. 2A and 2B, edges of the adjacent first sub-pixels 121 and the second sub-pixels 122 in the first sub-pixel row 310 close to the same second sub-pixel row are uneven (for example, lower edges in FIG. 2A are uneven).

In some examples, as shown in FIGS. 2A and 2B, the plurality of first sub-pixels 121 and the plurality of second sub-pixels 122 in one of the first sub-pixel rows 310 are intersected with a first virtual straight line extending in the first direction. That is, the first virtual straight line extending in the first direction simultaneously passes through the plurality of first sub-pixels 121 and the plurality of second sub-pixels 122 in one of the first sub-pixel rows 310. In this way, the plurality of first sub-pixels 121 and the plurality of second sub-pixels 122 in the first sub-pixel row are closer to a straight line in human vision, thus the fluctuation of the first sub-pixel row 310 can be further alleviated, so that the "sense of fluctuation" or "sense of jaggedness" of the display image can be further alleviated or even eliminated.

In some examples, as shown in FIGS. 2A and 2B, the plurality of first sub-pixels 121 and the plurality of second sub-pixels 122 in the first sub-pixel row 310 are uniformly distributed in the first direction, so that the display quality of the array substrate can be improved.

In some examples, as shown in FIG. 2A, in the same pixel group row 120, centers of all of the first sub-pixels 121 may be located on a same straight line; centers of all of the second sub-pixels 121 may be located on a same straight line; centers of all of the third sub-pixels 123 may be located on a same straight line; centers of all of the fourth sub-pixels 124 may be located on a same straight line.

In some examples, as shown in FIG. 2A, in each of the pixel groups 120, no other sub-pixel is arranged between the first sub-pixel 121 and the third sub-pixel 123, no other sub-pixel is arranged between the first sub-pixel 121 and the fourth sub-pixel 124; similarly, no other sub-pixel is arranged between the second sub-pixel 122 and the third sub-pixel 123, and no other sub-pixel is arranged between the second sub-pixel 122 and the fourth sub-pixel 124.

In some examples, as shown in FIG. 2A, the array substrate 100 further includes: sub-pixel intervals 170, which are arranged between two adjacent sub-pixels, the sub-pixels can be any one kind of the first sub-pixels 121, the second sub-pixels 122, the third sub-pixels 123 and the fourth sub-pixels mentioned above; each of the pixel groups 120 includes only four sub-pixels separated by the sub-pixel intervals 170.

In some examples, as shown in FIG. 2A, the array substrate 100 further includes spacers 250, the spacers 250 can be used to support a mask (for example, a fine metal mask) for forming the first sub-pixels, the second sub-pixels, the third sub-pixels and the fourth sub-pixels mentioned above during the manufacturing process of the array substrate. The spacers 250 are located between the first sub-pixels 121 and the second sub-pixels 122 that are adjacent to each other in the first sub-pixel row 310.

In the array substrate provided by the embodiments of the present disclosure, because the included angle θ between the connection line of the center of the first sub-pixel 121 and the center of the second sub-pixel 122 that are adjacent to each other in the first sub-pixel row 310 and the first direction is decreased, that is, a distance between the first sub-pixel 121 and the second sub-pixel 122 that are adjacent to each other in the second direction is reduced, thus the aspect ratios of the third sub-pixels and the fourth sub-pixels are decreased, so that blank areas are left between the first sub-pixels 121 and the second sub-pixels 122 that are adjacent to each other. The array substrate can use the blank area to set spacers, so that the spacers can be prevented from rubbing against an opening edge of the mask during the manufacturing process to generate particles, then adverse effects of the particles on the display quality can be avoided.

In some examples, as shown in FIG. 2A, a number of the plurality of second sub-pixel rows 320 is K, the spacers are further located between the third sub-pixel in the j-th second sub-pixel row and the fourth sub-pixel in the (j+1)-th second sub-pixel row, or the spacers are further located between the fourth sub-pixel in the j-th second sub-pixel row and the third sub-pixel in the (j+1)-th second sub-pixel row, K is a positive integer greater than or equal to 3, and j is a positive integer greater than or equal to 1 and less than or equal to K. In some examples, as shown in FIG. 2A, the array substrate 100 includes a plurality of spacers 250, lines connecting centers of the plurality of spacers 250 may form a rectangular grid or a diamond grid.

In some examples, as shown in FIG. 2A, the centers of all of the third sub-pixels 123 and the fourth sub-pixels 124 in the second sub-pixel row 320 may be located on a virtual straight line extending along the first direction, so that display symmetry can be improved.

Figure 3A:
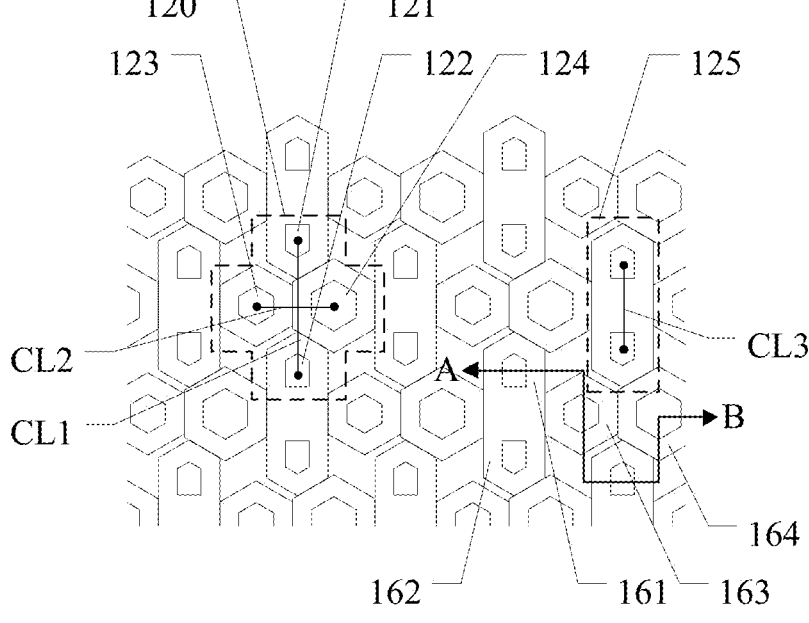
FIG. 3A is a partial schematic diagram of an array substrate provided by an embodiment of the present disclosure.
Figure 3B:
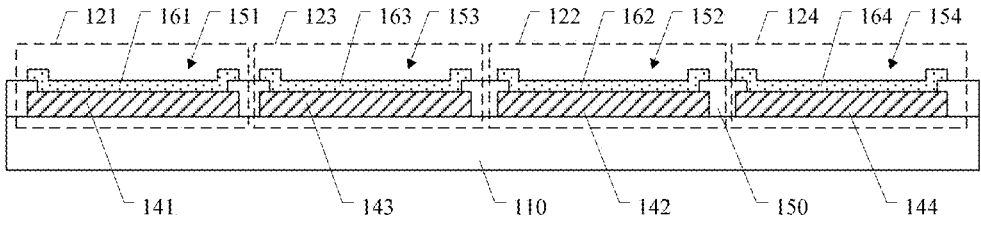
FIG. 3B is a cross-sectional schematic diagram of an array substrate along an AB direction in FIG. 3A provided by an embodiment of the present disclosure.

FIG. 3A is a partial schematic diagram of an array substrate provided by an embodiment of the disclosure; and FIG. 3B is a cross-sectional schematic diagram of an array substrate along an AB direction in FIG. 3A provided by an embodiment of the present disclosure.

In some examples, as shown in FIGS. 2A and 3A, a ratio of a size of the third sub-pixel 123 in the second direction to a size of the third sub-pixel 123 in the first direction is less than 3.5. In this way, by reducing an aspect ratio of the third sub-pixel 123, the centers of the first sub-pixels 121 and the centers of the second sub-pixels 122 that are adjacent in the first sub-pixel row 310 can be set closer, for example, the included angle between the connection line of the center of the first sub-pixel 121 and the center of the second sub-pixel 122 that are adjacent to each other and the first direction is less than 15 degrees. On the other hand, by arranging the ratio of the size of the third sub-pixel 123 in the second direction to the size of the third sub-pixel 123 in the first direction to be less than 3.5, display symmetry of the pixel group can further be improved. It should be noted that the size of the above-mentioned third sub-pixel may be a size of the effective light-emitting region of the third sub-pixel.

In some examples, as shown in FIGS. 2A and 3A, the ratio of the size of the third sub-pixel 123 in the second direction to the size of the third sub-pixel 123 in the first direction is less than 2. In this way, by reducing the aspect ratio of the third sub-pixel 123, the centers of the first sub-pixels 121 and the centers of the second sub-pixels 122 that are adjacent to each other in the first sub-pixel row 310 can be set closer, for example, the included angle between the connection line of the center of the first sub-pixel 121 and the center of the second sub-pixel 122 that are adjacent to each other and the first direction is less than 15 degrees. On the other hand, by setting the ratio of the size of the third sub-pixel 123 in the second direction to the size of the third sub-pixel 123 in the first direction to be less than 2, the display symmetry of the pixel group can further be improved. It should be noted that the size of the above-mentioned third sub-pixel may be the size of the effective light-emitting region of the third sub-pixel.

In some examples, as shown in FIGS. 2A and 3A, the ratio of the size of the third sub-pixel 123 in the second direction to the size of the third sub-pixel 123 in the first direction is less than 1.2. In this way, the array substrate can further make the centers of the first sub-pixels and the centers of the second sub-pixels that are adjacent to each other in the first sub-pixel row set closer, and the display symmetry of the pixel group can be further improved.

In some examples, as shown in FIGS. 2A and 3A, the first sub-pixel 121 in one pixel group 120 in the i-th pixel group row 210 is at least partially located between two adjacent pixel groups 120 in the (i+1)-th pixel group row 210, for example, the first sub-pixel 121 is located between the third sub-pixel 123 and the fourth sub-pixel 124 that are adjacent to each other. That is, an orthographic projection of the i-th pixel group row 210 on a reference line extending along the second direction partially overlaps an orthographic projection of the (i+1)-th pixel group row 210 on a reference line extending along the second direction. In this way, the array substrate can arrange two pixel group rows 210 adjacent to each other more closely, so that the pixel density and opening rate can be improved.

For example, as shown in FIGS. 2A and 3A, an ortho-graphic projection of the first sub-pixel 121 in one pixel group 120 in the i-th pixel group row 210 on the reference line extending along the second direction is at least partially overlapped with orthographic projections of the two adja-cent pixel groups 120 in the (i+1)-th pixel group row 210 on the reference line extending along the second direction; and the orthographic projection of the first sub-pixel 121 in one pixel group 120 in the i-th pixel group row 210 on the reference line extending along the second direction is at least partially overlapped with orthographic projections of the third sub-pixel 123 and the fourth sub-pixel 124 which are adjacent to each other in the (i+1)-th pixel group row 210 on the reference line extending in the second direction.

In some examples, as shown in FIGS. 2A and 3A, the i-th pixel group row 210 is aligned with the (i+2)-th pixel group row 210 in the first direction, a first sub-pixel 121 in the i-th pixel group row 210 and a second sub-pixel 122 in the (i+2)-th pixel group row 210 form a sub-pixel pair 125, in the sub-pixel pair 125, a third connection line CL3 between the center of the first sub-pixel 121 and the center of the second sub-pixel 122 is parallel to the second direction. In this way, the array substrate has better display quality.

In some examples, as shown in FIGS. 2A and 3A, a farthest distance in the second direction between an effective light-emitting region of the first sub-pixel 121 and an effective light-emitting region of the second sub-pixel 122 in the sub-pixel pair 125 is greater than a size of the third sub-pixel 123 in the second direction and a size of the fourth sub-pixel 124 in the second direction.

In some examples, as shown in FIG. 3B, the array substrate 100 further includes a first color pixel electrode 141, a second color pixel electrode 142, a third color pixel electrode 143 and a fourth color pixel electrode 144 on the base substrate 110; a pixel definition layer 150 located at a side of the first color pixel electrode 141, the second color pixel electrode 142, the third color pixel electrode 143 and the fourth color pixel electrode 144 away from the base substrate 110; and a first color light-emitting layer 161, a second color light-emitting layer 162, a third color light-emitting layer 163 and a fourth color light-emitting layer 164 located at a side of the pixel definition layer 150 away from the base substrate 110. The pixel definition layer 150 includes a first opening 151, a second opening 152, a third opening 153 and a fourth opening 154, the first opening 151 exposes the first color pixel electrode 141, the second opening 152 exposes the second color pixel electrode 142, the third opening 153 exposes the third color pixel electrode 143, and the fourth opening 154 exposes the fourth color pixel electrode 144; the first color light-emitting layer 161 is arranged in contact with a part of the first color pixel electrode 141 exposed by the first opening 151 through the first opening 151; the second color light-emitting layer 162 is arranged in contact with a part of the second color pixel electrode 142 exposed by the second opening 152 through the second opening 152; the third color light-emitting layer 163 is arranged in contact with a part of the third color pixel electrode 143 exposed by the third opening 153 through the third opening 153; and the fourth color light-emitting layer 164 is arranged in contact with a part of the fourth color pixel electrode 144 exposed by the fourth opening 154 through the fourth opening 154. At this time, a shape and sizes of the effective light-emitting region of the first sub-pixel 121 are defined by the first opening 151, a shape and sizes of the effective light-emitting region of the second sub-pixel 122 are defined by the second opening 152, a shape and sizes of the effective light-emitting region of the third sub-pixel 123 are defined by the third opening 153, and a shape and sizes of the effective light-emitting region of the fourth sub-pixel 124 are defined by the fourth opening 154.

For example, the first color pixel electrode 141 is con-figured to drive the first color light-emitting layer 161 to emit light of the first color; the second color pixel electrode 142 is configured to drive the second color light-emitting layer 162 to emit light of the second color; the third color pixel electrode 143 is configured to drive the third color light-emitting layer 163 to emit light of the third color; and the fourth color pixel electrode 144 is configured to drive the fourth color light-emitting layer 164 to emit light of the fourth color.

For example, the first color and the second color are both green, the third color is red, and the fourth color is blue. Of course, the embodiments of the present disclosure include but are not limited to this.

In some examples, as shown in FIG. 3A, the first color light-emitting layer 161 of the first sub-pixel 121 and the second color light-emitting layer 162 of the second sub-pixel 122 in the sub-pixel pair 125 are integrated into a same light-emitting layer. That is, the first color light-emitting layer 161 of the first sub-pixel 121 and the second color light-emitting layer 162 of the second sub-pixel 122 in the sub-pixel pair 125 may be formed through a same opening of a same fine mask (FMM).

For example, as shown in FIG. 3A, the first sub-pixel 121 and the second sub-pixel 122 may be configured to emit light of a same color. However, because the distance between the third sub-pixel 123 and the fourth sub-pixel 124 in the same pixel group 120 is relatively close, the first color light-emitting layer 161 of the first sub-pixel 121 and the second color light-emitting layer 162 of the second sub-pixel 122 in the same pixel group 120 may not be integrated together. On the contrary, the first color light-emitting layer 161 of the first sub-pixel 121 and the second color light-emitting layer 162 of the second sub-pixel 122 in the sub-pixel pair 125 may be integrated into a same light-emitting layer.

In some examples, as shown in FIGS. 3A and 3B, the first sub-pixel 121 may include the first color pixel electrode 141 and the first color light-emitting layer 161 arranged on the first color pixel electrode 141 mentioned above; the second sub-pixel 122 includes the second color pixel electrode 142 and the second color light-emitting layer 162 arranged on the second color pixel electrode 142; the third sub-pixel 123 includes the third color pixel electrode 143 and the third color light-emitting layer 163 arranged on the third color pixel electrode 143; and the fourth sub-pixel 124 includes the fourth color pixel electrode 144 and the fourth color light-emitting layer 164 arranged on the fourth color pixel electrode 144. It should be noted that each of the above-mentioned light-emitting layers may only include a light-emitting layer that emit light directly, and may also include auxiliary functional film layers such as an electron transport layer, an electron injection layer, a hole transport layer, and a hole injection layer.

It should be noted that the shapes and sizes of the first sub-pixel, the second sub-pixel, the third sub-pixel and the fourth sub-pixel mentioned above may be the shapes and sizes of the effective light-emitting regions of the first sub-pixel, the second sub-pixel, the third sub-pixel and the fourth sub-pixel respectively, which may be defined by a first via hole, a second via hole, a third via hole and a fourth via hole mentioned above. Therefore, the shapes of the first color pixel electrode, the second color pixel electrode, the third color pixel electrode and the fourth color pixel electrode may be different from the shapes of the first sub-pixel, the second sub-pixel, the third sub-pixel and the fourth sub-pixel mentioned above. Of course, the embodiments of the present disclosure include but are not limited to this, the shapes of the first color pixel electrode, the second color pixel electrode, the third color pixel electrode and the fourth color pixel electrode may also be the same as the shapes of the first sub-pixel, the second sub-pixel, the third sub-pixel and the fourth sub-pixel mentioned above.

On the other hand, the specific shapes of the first color light-emitting layer, the second color light-emitting layer, the third color light-emitting layer and the fourth color light-emitting layer can be set according to the manufacturing process, which are not limited in the embodiments of the present disclosure. For example, the shape of the first color light-emitting layer may be determined by a shape of a mask opening in the manufacturing process.

In some examples, as shown in FIG. 3B, the size of the first color pixel electrode 141 is larger than a size of the first opening 151, the size of the second color pixel electrode 142 is larger than a size of the second opening 152, the size of the third color pixel electrode 143 is larger than a size of the third opening 153, and the size of the fourth color pixel electrode 144 is larger than a size of the fourth opening 154. Moreover, a distance by which the first color pixel electrode 141 exceeds the first opening 151, a distance by which the second color pixel electrode 142 exceeds the second opening 152, a distance by which the third color pixel electrode 143 exceeds the third opening 153, and a distance by which the fourth color pixel electrode 144 exceeds the fourth opening 154 are approximately equal. That is, a shortest distance between an edge of the first color pixel electrode 141 and an edge of the first opening 151, a shortest distance between an edge of the second color pixel electrode 142 and an edge of the second opening 152, a shortest distance between an edge of the third color pixel electrode 143 and an edge of the third opening 153, and a shortest distance between an edge of the fourth color pixel electrode 144 and an edge of the fourth opening 154 are approximately equal.

Figure 4:
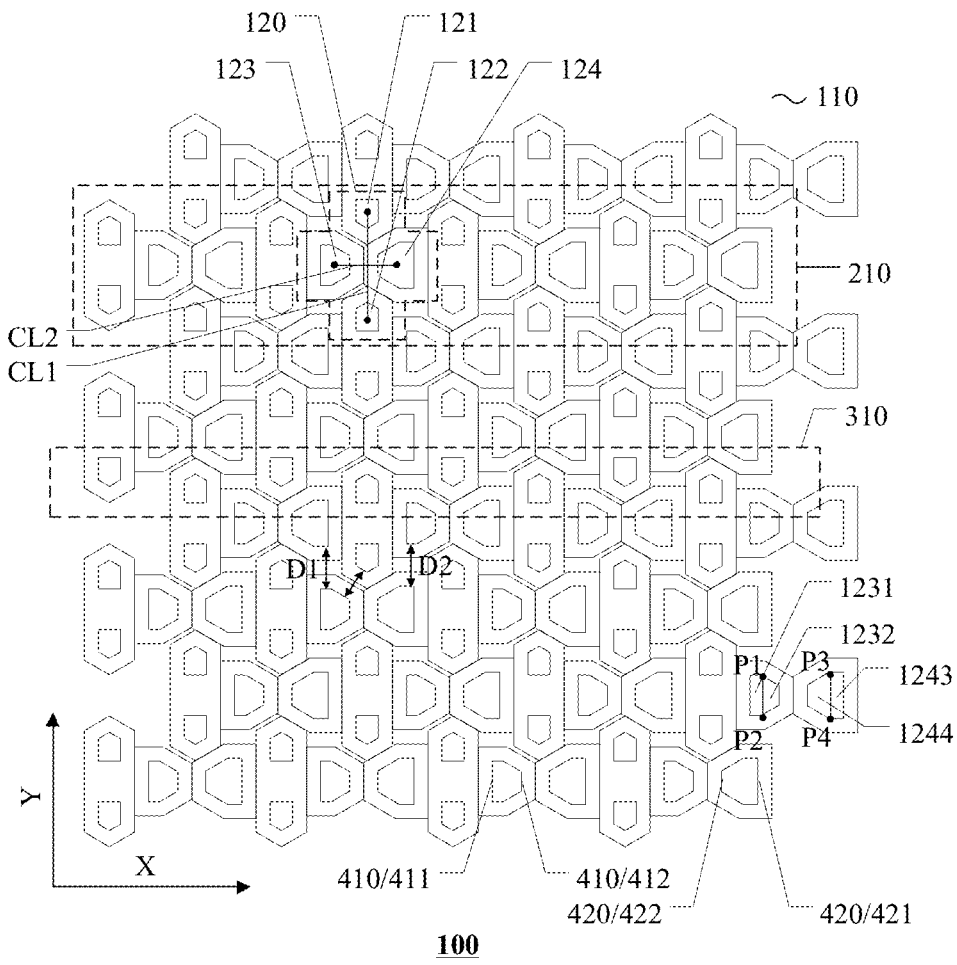
FIG. 4 is a schematic diagram of another array substrate provided by an embodiment of the present disclosure.
Figure 5:
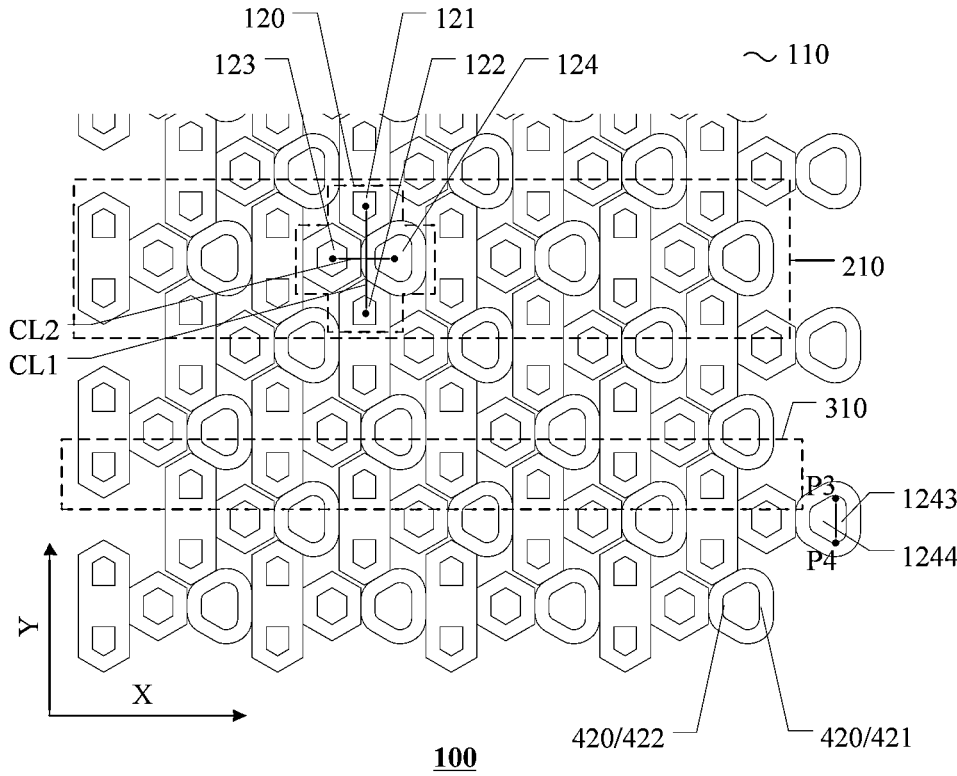
FIG. 5 is a schematic diagram of still another array substrate provided by an embodiment of the present disclosure.

FIG. 4 is a schematic diagram of another array substrate provided by an embodiment of the present disclosure; and FIG. 5 is a schematic diagram of still another array substrate provided by an embodiment of the present disclosure.

In some examples, as shown in FIGS. 4 and 5, a shape of an effective light-emitting region of a first sub-pixel 121 and a shape of an effective light-emitting region of a second sub-pixel 122 may both be symmetrical polygons, of course, the embodiments of the present disclosure include but are not limited to this.

In some examples, as shown in FIGS. 4 and 5, a shape of an effective light-emitting region of a third sub-pixel 123 and a shape of an effective light-emitting region of a fourth sub-pixel 124 may be a non-centrally symmetric polygon, so that the area of the array substrate can be fully utilized, thus the opening rate is increased.

For example, a number of sides of each of the shape of the effective light-emitting region of the first sub-pixel 121, the shape of the effective light-emitting region of the second sub-pixel 122, and the shape of the effective light-emitting region of the third sub-pixel 123 mentioned above is greater than five.

In some examples, as shown in FIG. 4, the shape of the effective light-emitting region of the third sub-pixel 123 includes a first parallel edge group 410, the first parallel edge group 410 includes a first parallel edge 411 and a second parallel edge 412 extending along the second direction; in one of the pixel groups 120, the first parallel edge 411 is located at a side of the second parallel edge 412 away from the fourth sub-pixel 124, a length of the first parallel edge 411 is greater than a length of the second parallel edge 412. In one of the pixel groups 120, a center connection line CL1 of a center of the first sub-pixel 121 and a center of the second sub-pixel 122 is located between a center of the third sub-pixel 123 and a center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the length of the first parallel edge to be greater than the length of the second parallel edge, on the one hand, the area of the effective light-emitting region of the third sub-pixel can be increased, on the other hand, a space utilization rate and the opening rate can be improved. It should be noted that the above-mentioned opening rate may be a ratio of the sum of the areas of the effective light-emitting regions of each of the sub-pixels in the array substrate to the area of the array substrate.

In some examples, as shown in FIGS. 4 and 5, the shape of the effective light-emitting region of the fourth sub-pixel 124 includes a second parallel edge group 420, the second parallel edge group 420 includes a third parallel edge 421 and a fourth parallel edge 422 extending along the second direction; in one of the pixel groups 120, the third parallel edge 421 is located at a side of the fourth parallel edge 422 away from the third sub-pixel 123, and a length of the third parallel edge 421 is greater than a length of the fourth parallel edge 422. In one of the pixel groups 120, the center connection line CL1 of the center of the first sub-pixel 121 and the center of the second sub-pixel 122 is located between the center of the third sub-pixel 123 and the center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the length of the third parallel edge to be greater than the length of the fourth parallel edge, on the one hand, the area of the effective light-emitting region of the fourth sub-pixel can be increased, and on the other hand, the space utilization rate and the opening rate can be improved.

It is worth noting that the extending directions of the first parallel edge, the second parallel edge, the third parallel edge and the fourth parallel edge are the same in a case that a fine metal mask (FMM) to manufacture the above-mentioned array substrate is adopted, and the extending directions can be a stretching direction of the fine metal mask (FMM), so that it is beneficial to the transmission of a tension force of the fine metal mask (FMM), and the product yield can be further improved.

In some examples, as shown in FIG. 4, the shape of the effective light-emitting region of the third sub-pixel 123 includes a first vertex P1 and a second vertex P2 with a largest distance in the second direction, the shape of the effective light-emitting region of the third sub-pixel 123 is divided into a first part 1231 and a second part 1232 by a connection line of the first vertex P1 and the second vertex P2; in one of the pixel groups 120, the first part 1231 is located at a side of the second part 1232 away from the fourth sub-pixel 124, an average size of the first portion 1231 in the second direction is larger than an average size of the second portion 1232 in the second direction. In one of the pixel groups 120, the center connection line CL1 of the center of the first sub-pixel 121 and the center of the second sub-pixel 122 is located between the center of the third sub-pixel 123 and the center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the size of the first portion in the second direction to be larger than the size of the second portion in the second direction, on the one hand, the area of the effective light-emitting region of the third sub-pixel can be increased, and on the other hand, the space utilization rate and the opening rate can be improved. It should be noted that the above-mentioned "average size" may be a weighted average size of the first part or the second part in the second direction.

In some examples, as shown in FIGS. 4 and 5, the shape of the effective light-emitting region of the fourth sub-pixel 124 includes the third vertex P3 and the fourth vertex P4 with a largest distance in the second direction, the shape of the effective light-emitting region of the fourth sub-pixel 124 is divided into a third part 1243 and a fourth part 1244 by a connection line of the third vertex P3 and the fourth vertex P4; in one of the pixel groups 120, the third portion 1243 is located at a side of the fourth portion 1244 away from the third sub-pixel 123, an average size of the third portion 1243 in the second direction is larger than an average size of the fourth portion 1244 in the second direction. In one of the pixel groups 120, the center connection line CL1 of the center of the first sub-pixel 121 and the center of the second sub-pixel 122 is located between the center of the third sub-pixel 123 and the center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the size of the third portion in the second direction to be larger than the size of the fourth portion in the second direction, on the one hand, the area of the effective light-emitting region of the fourth sub-pixel can be increased, and on the other hand, the space utilization rate and the opening rate can be improved.

In some examples, as shown in FIG. 5, because the luminous efficiency of the fourth sub-pixel 124 is reduced, its service life is also low, thus only the effective light-emitting region of the fourth sub-pixel 124 can be expanded outward, so that the area of the effective light-emitting region of the fourth sub-pixel is increased. At this time, the effective light-emitting region of the third sub-pixel 123 can still adopt a symmetrical shape.

In some examples, the luminous efficiency of the third sub-pixel 123 is greater than the luminous efficiency of the fourth sub-pixel 124, at this time, the area of the effective light-emitting region of the fourth sub-pixel 124 is larger than the area of the effective light-emitting region of the third sub-pixel 123. Because structure design and material system of the light-emitting devices are different, there are different service life of the sub-pixels that emit light of different colors. Therefore, by setting the area of the effective light-emitting region of the fourth sub-pixel to be larger than the area of the effective light-emitting region of the third sub-pixel, the above-mentioned difference in service life can be balanced, and an overall lifetime of the array substrate can be improved.

In some examples, as shown in FIGS. 4 and 5, a shortest distance D1 between the effective light-emitting region of one of the third sub-pixels 123 in the i-th pixel group row 210 and the effective light-emitting region of one of the fourth sub-pixels 124 in the (i+1)-th pixel group row 210 is less than twice the shortest distance between the effective light-emitting region of one of the first sub-pixels 121 and the effective light-emitting region of one of the third sub-pixels 123 in the same pixel group 120. In a common array substrate, the shortest distance between the effective light-emitting region of one of the third sub-pixels in the i-th pixel group row and the effective light-emitting region of one of the fourth sub-pixels in the (i+1)-th pixel group row is relatively large, in the array substrate provided by this example, by setting the above-mentioned shortest distance D1 to be less than twice the shortest distance between the effective light-emitting region of one of the first sub-pixels and the effective light-emitting region of one of the third sub-pixels in the same pixel group, the area of the third sub-pixel can be increased, and the opening rate can be improved.

In some examples, as shown in FIGS. 4 and 5, the shortest distance D1 between the effective light-emitting region of one of the third sub-pixels 123 in the i-th pixel group row 210 and the effective light-emitting region of one of the fourth sub-pixels 124 in the (i+1)-th pixel group row 210 is less than 1.5 times the shortest distance between the effective light-emitting region of one of the first sub-pixels 121 and the effective light-emitting region of one of the third sub-pixels 123 in the same pixel group 120. In this way, the array substrate can further increase the area of the third sub-pixel, and the opening rate can be improved.

In some examples, as shown in FIG. 5, a shortest distance D2 between the effective light-emitting region of one of the fourth sub-pixels 124 in the i-th pixel group row 210 and the effective light-emitting region of one of the third sub-pixels 123 in the (i+1)-th pixel group row 210 is less than twice a shortest distance between the effective light-emitting region of the first sub-pixel 121 and the effective light-emitting region of the fourth sub-pixel 124 in the same pixel group 120. In the common array substrate, the shortest distance between the effective light-emitting region of one of the fourth sub-pixels in the i-th pixel group row and the effective light-emitting region of one of the third sub-pixels in the (i+1)-th pixel group row is relatively large, in the array substrate provided in this example, by setting the above-mentioned shortest distance D2 to be less than twice the shortest distance between the effective light-emitting region of the first sub-pixel and the effective light-emitting region of the fourth sub-pixel in the same pixel group, the area of the fourth sub-pixel can be increased, and the opening rate can be improved.

In some examples, as shown in FIG. 5, the shortest distance D2 between the effective light-emitting region of one of the fourth sub-pixels 124 in the i-th pixel group row 210 and the effective light-emitting region of one of the third sub-pixels 123 in the (i+1)-th pixel group row 210 is less than 1.5 times the shortest distance between the effective light-emitting region of one of the first sub-pixels 121 and the effective light-emitting region of one of the fourth sub-pixels 124 in the same pixel group 120. In this way, the array substrate can further increase the area of the third sub-pixel, and the opening rate can be improved.

In some examples, as shown in FIG. 5, an edge of the effective light-emitting region of the fourth sub-pixel 124 may include a curved line.

In some examples, as shown in FIGS. 4 and 5, the first sub-pixel 121 in one of the pixel groups 120 in the i-th pixel group row 210 is at least partially located between two adjacent pixel groups 120 in the (i+1)-th pixel group row 210, for example, is located between the third sub-pixel 123 and the fourth sub-pixel 124 that are adjacent to each other. In this way, the array substrate can arrange two adjacent pixel group rows 210 more closely, so that the pixel density and the opening rate can be improved.

Figure 6:
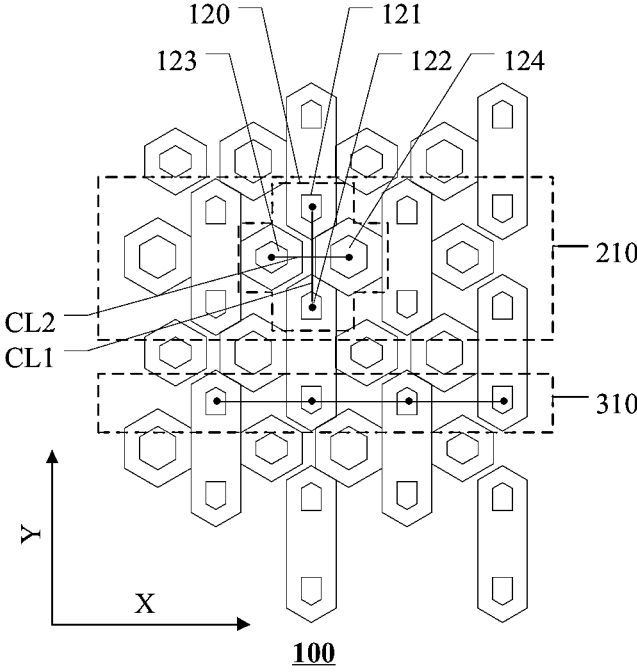
FIG. 6 is a schematic diagram of still another array substrate provided by an embodiment of the present disclosure.
Figures 7, 8:
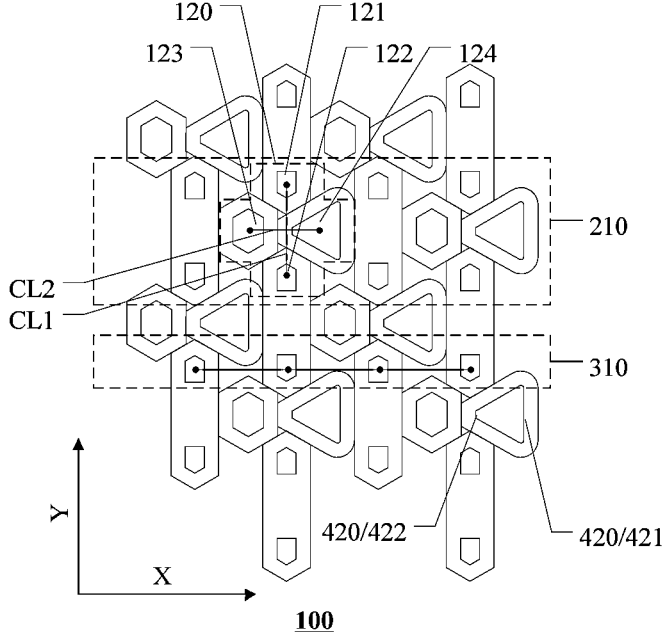
FIG. 7 is a schematic diagram of still another array substrate provided by an embodiment of the present disclosure.
FIG. 8 is a schematic diagram of a display device provided by an embodiment of the present disclosure.

FIG. 6 is a schematic diagram of still another array substrate provided by an embodiment of the present disclosure; and FIG. 7 is a schematic diagram of still another array substrate provided by an embodiment of the present disclosure.

As shown in FIG. 6 and FIG. 7, the array substrate 100 includes a base substrate 110 and a plurality of pixel groups 120 located on the base substrate 110; each of the plurality of pixel group 120 includes a first sub-pixel 121, a second sub-pixel 122, a third sub-pixel 123 and a fourth sub-pixel 124. In each of the plurality of pixel groups 120, a first connection line CL1 of a center of the first sub-pixel 121 and a center of the second sub-pixel 122 is intersected with a second connection line CL2 of a center of the third sub-pixel 123 and a center of the fourth sub-pixel 124. It should be noted that, in the pixel group 120, the first sub-pixel 121 and the second sub-pixel 122 can be sub-pixels emitting light with a same color; in addition, shapes of the first sub-pixel 121 and the second sub-pixel 122 may also be the same, a difference between the first sub-pixel 121 and the second sub-pixel 122 is that their positions are different. In addition, the above-mentioned "center" refers to a luminance center or a geometric center of an effective light-emitting region of each of the sub-pixels.

As shown in FIG. 6 and FIG. 7, the plurality of pixel groups 120 are arranged along the first direction to form N pixel group rows 210; the N pixel group rows 210 are arranged in the second direction, two pixel group rows 210 which are adjacent to each other are arranged in a staggered manner in the first direction, that is, centers of orthographic projections of the pixel groups with a same ordinal number in two pixel group rows 210 which are adjacent to each other on a reference line extending in the first direction do not overlap. Therefore, the two pixel group rows 210 which are adjacent to each other can be arranged closer and more closely in the second direction, so as to improve the pixel density or resolution.

As shown in FIG. 6 and FIG. 7, the plurality of first sub-pixels 121 in the i-th pixel group row 210 and the plurality of second sub-pixels 122 in the (i+1)-th pixel group row 210 are alternately arranged in the first direction, to form a first sub-pixel row 310; and in one of the first sub-pixel rows 310, an included angle θ between a connection line CL of the center of the first sub-pixel 121 and the center of the second sub-pixel 122 that are adjacent to each other and the first direction is less than or equal to 10 degrees, N is a positive integer greater than or equal to 3, and i is a positive integer greater than or equal to 1 and less than or equal to N.

In the array substrate provided by the embodiments of the present disclosure, the first sub-pixel 121 and the second sub-pixel 122 may be sub-pixels that emit light of a same color, and the color of the sub-pixels is sensitive to the human eye. Because the included angle θ between the connection line CL of the center of the first sub-pixels 121 and the center of the second subpixels 122 that are adjacent to each other in the first subpixel row 310 and the first direction is less than or equal to 10 degrees, the sense of fluctuation of the first sub-pixel row 310 is smaller, and the first sub-pixel row 310 is closer to a straight line in human vision, so that the "sense of fluctuation" or "sense of jaggedness" of the display image can be alleviated or even eliminated, and thus the lines of the display image are more continuous and natural.

For example, in one of the first sub-pixel rows 310, the included angle θ between the connection line CL of the centers of the first sub-pixels 121 and the centers of the second sub-pixels 122 that are adjacent to each other and the first direction is equal to 0 degrees; that is, the centers of all the first sub-pixels 121 and the centers of the second sub-pixels 122 in the first sub-pixel row 310 may be located on a same straight line, and the straight line is parallel to the first direction. Therefore, the array substrate can eliminate the sense of fluctuation of the first sub-pixel row 310, so that the "sense of fluctuation" or "sense of jaggedness" of the display image is eliminated.

In some examples, as shown in FIGS. 6 and 7, the first sub-pixel rows 310 may be uniformly arranged in the second direction, that is, distances between any two adjacent first sub-pixel rows 310 are equal, so that the uniformity and symmetry of the pixel arrangement of the array substrate are further improved, thus the display quality can be further improved.

In some examples, as shown in FIG. 7, because the luminous efficiency of the fourth sub-pixel 124 is reduced, the service life is also low, thus only the effective light-emitting region of the fourth sub-pixel 124 can be expanded outward, so that the area of the effective light-emitting region of the fourth sub-pixel is increased.

For example, as shown in FIG. 7, the shape of the effective light-emitting region of the fourth sub-pixel 124 includes a second parallel edge group 420, the second parallel edge group 420 includes a third parallel edge 421 and a fourth parallel edge 422 extending along the second direction; in one of the pixel groups 120, the third parallel edge 421 is located at a side of the fourth parallel edge 422 away from the third sub-pixel 123, a length of the third parallel edge 421 is greater than a length of the fourth parallel edge 422. In one of the pixel groups 120, the center connection line CL1 of the first sub-pixel 121 and the second sub-pixel 122 is located between the center of the third sub-pixel 123 and the center of the fourth sub-pixel 124, thus a larger space is provided on a side of the effective light-emitting region of the third sub-pixel 123 and the effective light-emitting region of the fourth sub-pixel 124 away from the center connection line CL1. Therefore, by setting the length of the third parallel edge to be greater than the length of the fourth parallel edge, on the one hand, the area of the effective light-emitting region of the fourth sub-pixel can be increased, and on the other hand, the space utilization rate and the opening rate can be improved.

In some examples, the luminous efficiency of the third sub-pixel 123 is greater than the luminous efficiency of the fourth sub-pixel 124, at this time, the area of the effective light-emitting region of the fourth sub-pixel 124 is larger than the area of the effective light-emitting region of the third sub-pixel 123. Because structure design and material system of the light-emitting devices are different, there are different service life of the sub-pixels that emit light of different colors. Therefore, by setting the area of the effective light-emitting region of the fourth sub-pixel to be larger than the area of the effective light-emitting region of the third sub-pixel, the above-mentioned difference in service life can be balanced, and an overall service life of the array substrate can be improved.

At least one embodiment of the present disclosure further provides a display device. FIG. 8 is a schematic diagram of a display device provided by an embodiment of the disclosure. As shown in FIG. 8, the display device 500 includes the above-mentioned array substrate 100. Because the included angle between the connection line of the center of the first sub-pixels and the center of the second sub-pixels that are adjacent to each other in the first sub-pixel row and the first direction is less than 20 degrees in the array substrate, the sense of fluctuation of the first sub-pixel row is smaller, the first sub-pixel row is closer to a straight line in human vision, so that the "sense of fluctuation" or "sense of jaggedness" of the display image can be alleviated or even eliminated, thus the display device can have a higher resolution, at the same time, the display device has a high display quality.

For example, in some examples, the display device can be any product or component with a display function, such as a smart phone, a tablet computer, a TV, a monitor, a notebook computer, a digital photo frame, and a navigator.

Figure 9:
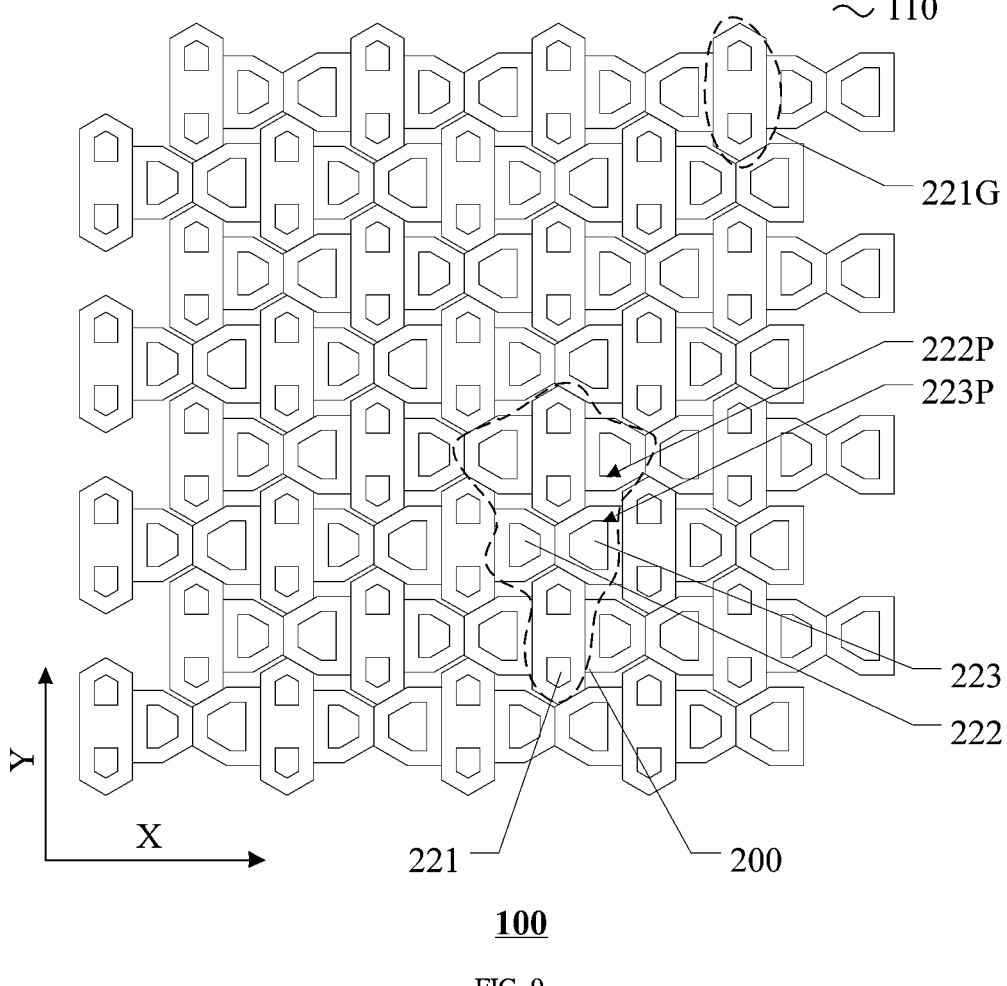
FIG. 9 is a schematic diagram of still another array substrate provided by an embodiment of the present disclosure.

At least one embodiment of the present disclosure further provides an array substrate. FIG. 9 is a schematic view illustrating another type of array substrate provided by one embodiment of the present disclosure. As shown in FIG. 9, the array substrate 100 includes a plurality of sub-pixel repeating units 200, repetitively arranged along at least one of a first direction X and a second direction Y; each sub-pixel repeating unit 200 includes four first color sub-pixels 221, two second color sub-pixels 222, and two third color sub-pixels 223. The first direction intersects the second direction, the first color sub-pixels 221 are configured to emit light of a first color, the second color sub-pixels 222 are configured to emit light of a second color, and the third color sub-pixels 223 are configured to emit light of a third color.

For example, the first color may be green, the second color may be red, and the third color may be blue. Of course, the embodiments of the present disclosure include but are not limited thereto.

As shown in FIG. 9, in one sub-pixel repeating unit 200, the shape of each first color sub-pixel 221 includes an edge parallel to the first direction and an edge an edge parallel to the second direction, and the shape of each first color sub-pixel 221 is an axisymmetric figure, and at least one symmetrical axis of the axisymmetric figure is parallel to the first direction or the second direction, the centers of the four first color sub-pixels 221 are located on the same virtual line extending along the second direction, the center of one second color sub-pixel 222 of the two second color sub-pixels 222 and the center of one third color sub-pixel 223 of the two third color sub-pixels 223 are located on a first side of the virtual line in the first direction, the center of the other one second color sub-pixel 222 of the two second color sub-pixels 222 and the center of the other one third color sub-pixel 223 of the two third color sub-pixels 223 are located on a second side of the virtual line in the first direction.

In the array substrate provided by the embodiments of the present disclosure, because the centers of the four first color sub-pixels are located on the same virtual line extending along the second direction, the center of one second color sub-pixel of the two second color sub-pixels and the center of one third color sub-pixel of the two third color sub-pixels are located on the first side of the virtual line in the first direction, and the center of the other one second color sub-pixel of the two second color sub-pixels and the center of the other one third color sub-pixel of the two third color sub-pixels are located on the second side of the virtual line in the first direction, as such, upon the array substrate being used for displaying a vertical line extending along the second direction, and the first color sub-pixel is a color to which human eye is sensitive, "sense of fluctuation" of the vertical line seen by human eyes is relatively weak, thereby reducing or even eliminating the graininess sense of the display picture, and making the line of the display picture more continuous and natural. In addition, because the shape of each first color sub-pixel includes the edge parallel to the first direction and the edge parallel to the second direction, and the shape of each first color sub-pixel is an axisymmetric figure, at least one symmetrical axis of the axisymmetric figure is parallel to the first direction or the second direction, therefore, the array substrate can also ameliorate the "sense of fluctuation" or "sense of being like sawtooth" of the vertical line along the first direction or the second direction on the display picture through the shape of the first color sub-pixel itself.

On the other hand, the centers of the four first color sub-pixels being located on the same virtual line extending along the second direction is also advantage for color mixing, and at least two of the four first color sub-pixels can be made using a same mask opening, such that fine sub-pixels can be realized more easily. It is noted that, in the case where at least two of the four first color sub-pixels can be made using the same mask opening, at least two first color sub-pixels share one light-emitting layer (i.e. the above-described first color light-emitting layer, the second color light-emitting layer and the third color light-emitting layer).

In some examples, as shown in FIG. 9, the array substrate 100 further includes a base substrate 110; the plurality of sub-pixel repeating units 200 are disposed on the base substrate 110.

In some examples, as shown in FIG. 9, in each sub-pixel repeating unit 200, the light-emitting layers of at least two first color sub-pixels 221 of the four first color sub-pixels 221 are disposed to be continuous; that is to say, the orthographic projections of the light-emitting layers of at least two first color sub-pixels 221 of the four first color sub-pixels 221 on the base substrate 110 are continuous.

In some examples, as shown in FIG. 9, in each sub-pixel repeating unit 200, a size in the second direction of the shape of each second color sub-pixel 222 is larger than a size in the second direction of the shape of the first color sub-pixel 221, and a size in the second direction of the shape of each third color sub-pixel 223 is larger than the size in the second direction of the shape of the first color sub-pixel 221.

In some examples, as shown in FIG. 9, in each sub-pixel repeating unit 200, one of the two second color sub-pixels 222 and one of the two third color sub-pixels 223 are located on the first side of the virtual line in the first direction, while the other one of the two second color sub-pixels 222 and the other one of the two third color sub-pixels 223 are located on the second side of the virtual line in the first direction; the shape of each second color sub-pixel 222 includes an edge parallel to the second direction, and the shape of each third color sub-pixel 223 includes an edge parallel to the second direction. As such, the array substrate can reduce or even eliminate the "sense of being like sawtooth" of the display picture, thereby improving the display quality.

In some examples, as shown in FIG. 9, in each sub-pixel repeating unit 200, a length of the longest edge parallel to the second direction of the shape of each second color sub-pixel 222 is greater than a length of the edge parallel to the second direction of the shape of the first color sub-pixel 221, and the length of the longest edge parallel to the second direction of the shape of each third color sub-pixel 223 is greater than the length of the edge parallel to the second direction of the shape of the first color sub-pixel 221.

In some examples, as shown in FIG. 9, in each sub-pixel repeating unit 200, the arrangement sequence in the second direction of the second color sub-pixel 222 and the third color sub-pixel 223 on the first side of the four first color sub-pixels 221 is reversed from the arrangement sequence in the second direction of the second color sub-pixel 222 and the third color sub-pixel 223 on the second side of the four first color sub-pixels 221. In this case, one second color sub-pixel 222 and one third color sub-pixel 223 are disposed to face each other.

In some examples, as shown in FIG. 9, in each sub-pixel repeating unit 200, the orthographic projections of the second color sub-pixel 222 and the third color sub-pixel 223 that are disposed on a same side of the four first color sub-pixels 221 in the first direction on a reference line parallel to the first direction are overlapped with each other, and the connection line between the center of the second color sub-pixel 222 and the center of the third color sub-pixel 223 that are disposed on the same side of the four first color sub-pixels 221 in the first direction is not parallel to the second direction. As such, the array substrate can improve the pixel density and make full use of the space on the array substrate.

In some examples, as shown in FIG. 9, in each sub-pixel repeating unit 200, the size in the second direction of the sub-portion away from the four first color sub-pixels 221 of at least one of the two second color sub-pixels 222 is smaller than the size in the second direction of the sub-portion adjacent to the four first color sub-pixels 221 thereof, and the size in the second direction of sub-portion away from the four first color sub-pixels 221 of at least one of the two third color sub-pixels 223 is smaller than the size in the second direction of the sub-portion adjacent to the four first color sub-pixels 221 thereof. Therefore, the array substrate can make at least one second color sub-pixel and at least one third color sub-pixel as adjacent to the connection line of centers of the four first color sub-pixels as possible, thereby further reducing or even eliminating the graininess sense of the display picture, and making the line of the display picture more continuous and natural.

In some examples, as shown in FIG. 9, the shape of the second color sub-pixel 222 includes an edge parallel to the first direction, an edge parallel to the second direction, and an inclined edge. Alternatively, the shape of the third color sub-pixel 223 includes an edge parallel to the first direction, an edge parallel to the second direction, and an inclined edge. It should be noted that, the above-described inclined edge refers to an edge not parallel to the first direction and the second direction.

In some examples, as shown in FIG. 9, in each sub-pixel repeating unit 200, the areas of the four first color sub-pixels 221 are equal. It is noted that, the above-described areas being equal includes the case where the areas of the four first color sub-pixels are exactly equal, and also includes the case where the difference between the areas of the four first color sub-pixels and the average value of the areas of the four first color sub-pixels is less than 10% of the average value, that is, it also includes the case where the areas are approximately equal. Of course, the embodiments of the present disclosure include, but are not limited thereto, and the areas of the four first color sub-pixels may also be different.

In some examples, as shown in FIG. 9, in each sub-pixel repeating unit 200, the edges adjacent to the four first color sub-pixels 221 of the second color sub-pixel 222 and the third color sub-pixel 223 on the same side of four first color sub-pixels 221 in the first direction are both parallel to the second direction, and the edges away from the four first color sub-pixels 221 of the second color sub-pixel 222 and the third color sub-pixel 223 on the same side of four first color sub-pixels 221 in the first direction are also both parallel to the second direction. As such, the array substrate can reduce or even avoid the generation of sense of being like sawtooth in the second direction.

In some examples, as shown in FIG. 9, in each sub-pixel repeating unit 200, the span length in the second direction of the second color sub-pixel 222 and the third color sub-pixel 223 on the same side of the four first color sub-pixels 221 in first direction is less than or equal to the span length in the second direction of the four first color sub-pixels. It should be noted that, the above-described "span length" refers to the total length occupied by the several sub-pixels themselves and the interval therebetween.

In some examples, as shown in FIG. 9, in each sub-pixel repeating unit 200, the second color sub-pixel 222 and the third color sub-pixel 223 on the same side of the four first color sub-pixels 221 in the first direction have a first parallel edge 222*p* and a second parallel edge 223*p* that are disposed facing and parallel to each other. As such, the array substrate can reduce or even avoid generating the sense of being like sawtooth in the first direction.

In some examples, as shown in FIG. 9, the distance between the first parallel edge 222P and the second parallel edge 223P is the minimum distance between the second color sub-pixel 222 and the third color sub-pixel 223.

In some examples, as shown in FIG. 9, the length of the first parallel edge 222P and the length of the second parallel edge 223P are equal.

In some examples, as shown in FIG. 9, the orthographic projection of the first parallel edge 222P on a reference line parallel to the first direction is overlapped with the orthographic projection of the second parallel edge 223P on the reference line parallel to the first direction. As such, the array substrate can improve the compactness of sub-pixels, thereby improving the pixel density.

In some examples, as shown in FIG. 9, in each sub-pixel repeating unit 200, the spacing between the two third color sub-pixels 223 in the second direction is less than the spacing between the two second color sub-pixels 222 in the second direction.

In some examples, as shown in FIG. 9, in each sub-pixel repeating unit 200, the four first color sub-pixels 221 include two sub-pixel pairs 221G arranged along the second direction, each sub-pixel pair 221G includes two first color sub-pixels 221, and the distance between the two sub-pixel pairs 221G is greater than the distance between the two first color sub-pixels 221 in the sub-pixel pair 221G.

In some examples, as shown in FIG. 9, in each sub-pixel repeating unit 200, the two first color sub-pixels 221 in each sub-pixel pair 221G are symmetrically disposed, for example, are axisymmetric with respect to a straight line extending along the first direction; the two sub-pixel pairs 221G are symmetrically disposed, for example, are axisymmetric with respect to a straight line extending along the first direction.

In some examples, as shown in FIG. 9, in each sub-pixel repeating unit 200, the orthographic projections of the four first color sub-pixels 221 on a reference line in the first direction are overlapped, and the sizes of the four first color sub-pixels 221 on a reference line in the second direction are equal.

In some examples, as shown in FIG. 9, in each sub-pixel repeating unit 200, the orthographic projection of each second color sub-pixel 222 on a reference line parallel to the second direction falls within the orthographic projection of one third color sub-pixel 223 on the reference line.

In some examples, as shown in FIG. 9, any two adjacent first color sub-pixels 221 of the four first color sub-pixels 221 include two parallel edges disposed facing each other. For example, as shown in FIG. 9, both the two parallel edges are parallel to the first direction.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other to obtain new embodiments.

The above are only the specific embodiments of this disclosure, but the scope of protection of this disclosure is not limited to this. Any person familiar with this technical field can easily think of changes or substitutions within the technical scope disclosed in this disclosure, which should be covered by the scope of protection of this disclosure. Therefore, the scope of protection of this disclosure should be based on the scope of protection of the claims.

What is claimed is:

1. An array substrate, comprising:

a plurality of sub-pixel repeating units, repetitively arranged along at least one of a first direction and a second direction, each of the plurality of sub-pixel repeating units comprises four first color sub-pixels, two second color sub-pixels and two third color sub-pixels, and the first direction intersects the second direction, wherein, in one of the plurality of sub-pixel repeating units, a shape of each of the four first color sub-pixels comprises an edge parallel to the first direction and an edge parallel to the second direction, and the shape of each of the four first color sub-pixels is an axisymmetric figure, and at least one symmetrical axis of the axisymmetric figure is parallel to the first direction or the second direction, centers of the four first color sub-pixels are located on a same virtual line extending along the second direction, and a center of one second color sub-pixel of the two second color sub-pixels and a center of one third color sub-pixel of the two third color sub-pixels are located on a first side of the virtual line in the first direction, a center of the other one second color sub-pixel of the two second color sub-pixels and a center of the other one third color sub-pixel of the two third color sub-pixels are located on a second side of the virtual line in the first direction, in one of the plurality of sub-pixel repeating units, the second color sub-pixel and the third color sub-pixel on a same side of the four first color sub-pixels in the first direction have a first parallel edge and a second parallel edge that face each other and are parallel to each other, both the first parallel edge and the second parallel edge extend in the first direction.

2. The array substrate according to claim 1, wherein, in one of the plurality of sub-pixel repeating units, a size in the second direction of a shape of one of the two second color sub-pixels is greater than a size in the second direction of a shape of one of the four first color sub-pixels, and a size in the second direction of a shape of one of the two third color sub-pixels is greater than a size in the second direction of a shape of one of the four first color sub-pixels.

3. The array substrate according to claim 1, wherein, in the plurality of sub-pixel repeating units, one second color sub-pixel of the two second color sub-pixels and one third color sub-pixel of the two third color sub-pixels are located on the first side of the virtual line in the first direction, the other one second color sub-pixel of the two second color sub-pixels and the other one third color sub-pixel of the two third color sub-pixels are located on the second side of the virtual line in the first direction, a shape of each of the two second color sub-pixels comprises a edge parallel to the second direction, and a shape of each of the two third color sub-pixels comprises a edge parallel to the second direction.

4. The array substrate according to claim 3, wherein, in the plurality of sub-pixel repeating units, a longest edge parallel to the second direction of the shape of each of the two second color sub-pixels is greater than a length of at least one edge parallel to the second direction of a shape of the first color sub-pixel, and a longest edge parallel to the second direction of the shape of each of the two third color sub-pixels is greater than a length of at least one edge parallel to the second direction of a shape of the first color sub-pixel.

5. The array substrate according to claim 3, wherein, in one of the plurality of sub-pixel repeating units, an arrangement sequence in the second direction of the second color sub-pixel and the third color sub-pixel on the first side of the four first color sub-pixels is reversed from an arrangement sequence in the second direction of the second color sub-pixel and the third color sub-pixel on the second side of the four first color sub-pixels.

6. The array substrate according to claim 1, wherein, in one of the plurality of sub-pixel repeating units, orthographic projections of the second color sub-pixel and the third color sub-pixel that are located on a same side of the four first color sub-pixels in the first direction on a reference line parallel to the first direction are overlapped with each other, and a connection line between a center of the second color sub-pixel and a center of the third color sub-pixel on a same side of the four first color sub-pixels in the first direction is not parallel to the second direction.

7. The array substrate according to claim 1, wherein, in one of the plurality of sub-pixel repeating units, a size in the second direction of a sub-portion of at least one of the two second color sub-pixels away from the four first color sub-pixels is smaller than a size in the second direction of a sub-portion of the at least one of the two second color sub-pixels adjacent to the four first color sub-pixels, and a size in the second direction of a sub-portion of at least one of the two third color sub-pixels away from the four first color sub-pixels is smaller than a size in the second direction of a sub-portion of the at least one of the two third color sub-pixels adjacent to the four first color sub-pixels.

8. The array substrate according to claim 1, wherein, a shape of the second color sub-pixel comprises an edge parallel to the first direction, an edge parallel to the second direction and an inclined edge with an included angle with both the first direction and the second direction;

and/or, a shape of the third color sub-pixel comprises an edge parallel to the first direction, an edge parallel to the second direction and an inclined edge with an included angle with both the first direction and the second direction.

9. The array substrate according to claim 1, wherein, in the plurality of sub-pixel repeating units, areas of the four first color sub-pixels are equal.

10. The array substrate according to claim 1, wherein, in one of the plurality of sub-pixel repeating units, at least part of edges adjacent to the four first color sub-pixels of the second color sub-pixel and the third color sub-pixel on a same side in the first direction of the four first color sub-pixels are both parallel to the second direction, and at least part of edges away from the four first color sub-pixels of the second color sub-pixel and the third color sub-pixel on a same side in the first direction of the four first color sub-pixels are also both parallel to the second direction.

11. The array substrate according to claim 1, wherein, in one of the plurality of sub-pixel repeating units, a span length in the second direction of the second color sub-pixel and the third color sub-pixel on a same side of the four first color sub-pixels in the first direction is less than or equal to a span length in the second direction of the four first color sub-pixels.

12. The array substrate according to claim 1, wherein, in one of the plurality of sub-pixel repeating units, light-emitting layers of at least two first color sub-pixels of the four first color sub-pixels are continuously disposed.

13. The array substrate according to claim 1, wherein, a distance between the first parallel edge and the second parallel edge is a minimum distance between the second color sub-pixel and the third color sub-pixel.

14. The array substrate according to claim 1, wherein, a length of the first parallel edge is equal to a length of the second parallel edge, an orthographic projection of the first parallel edge on a reference line parallel to the first direction is overlapped with an orthographic projection of the second parallel edge on the reference line parallel to the first direction.

15. The array substrate according to claim 1, wherein, in one of the plurality of sub-pixel repeating units, a spacing between the two third color sub-pixels in the second direction is less than a spacing between the two second color sub-pixels in the second direction.

16. The array substrate according to claim 1, wherein, in one of the plurality of sub-pixel repeating units, the four first color sub-pixels comprise two sub-pixel pairs arranged along the second direction, each of the two sub-pixel pairs comprises two first color sub-pixels of the four first color sub-pixels, a distance between the two sub-pixel pairs is greater than a distance between the two first color sub-pixels in one of the two sub-pixel pairs.

17. The array substrate according to claim 1, wherein, in one of the plurality of sub-pixel repeating units, orthographic projections of the four first color sub-pixels on a reference line along the first direction are overlapped with each other, and sizes of the four first color sub-pixels on a reference line in the second direction are equal.

18. The array substrate according to claim 1, wherein, in one of the plurality of sub-pixel repeating units, an orthographic projection of each of the two second color sub-pixels on a reference line parallel to the second direction falls within an orthographic projection of one of the two third color sub-pixels on the reference line.

19. A display device, comprising an array substrate according to claim 1.

* * * * *